United States Patent [19]

Rauscher et al.

[11] 4,376,891
[45] Mar. 15, 1983

[54] METHOD AND APPARATUS FOR PRODUCING ELECTRON BEAM DIFFRACTION PATTERNS

[76] Inventors: Günter Rauscher, Finsterwalderstrasse 22, D-8000 Munich 50; Helmut Formanek, Römerhofweg 51, D-8046 Garching, both of Fed. Rep. of Germany

[21] Appl. No.: 329,076
[22] Filed: Dec. 9, 1981

Related U.S. Application Data

[63] Continuation of Ser. No. 145,003, Apr. 29, 1980, abandoned.

Foreign Application Priority Data

Mar. 5, 1980 [DE] Fed. Rep. of Germany ....... 3008404

[51] Int. Cl.³ .......................................... G01N 23/00
[52] U.S. Cl. .................................... 250/307; 250/311
[58] Field of Search ........................ 250/311, 307, 442

[56] References Cited

U.S. PATENT DOCUMENTS

| 3,137,791 | 6/1964 | Gütter | 250/311 |
| 3,719,776 | 3/1973 | Fujiyasu et al. | 250/311 |
| 3,737,659 | 6/1973 | Yanaka et al. | 250/311 |
| 4,045,669 | 8/1977 | Kamimura et al. | 250/311 |
| 4,189,641 | 2/1980 | Katagiri et al. | 250/311 |

OTHER PUBLICATIONS

"Electron Diffraction Studies of the Peptidoglycan of Bacterial Cell Walls", Formanek et al., Ultramicroscopy, 4, 1979, pp. 337-342.

Primary Examiner—Bruce C. Anderson
Attorney, Agent, or Firm—Birch, Stewart, Kolasch and Birch

[57] ABSTRACT

A method is disclosed of producing electron beam diffraction patterns, in which the object to be examined is one which is liable to be altered substantially by an electron beam when that beam is accelerated by a predetermined voltage to the energy density necessary for the production of an image. The object is irradiated by an electron beam and the electrons of the electron beam, diffracted by the object, are imaged using an integrating image apparatus or an integrating image material, for example a photographic layer. One or more regions of the object corresponding in size to the cross section of the electron beam are irradiated intermittently using an electron beam accelerated by the pre-determined voltage, the electron beam having an electron density which is lower than the electron density at which the object is substantially altered. Irradiation is carried out for such a period of time that the electron density of the electron beam, integrated during this time, is at least equal to the electron density necessary to produce an image.

15 Claims, 8 Drawing Figures

METHOD AND APPARATUS FOR PRODUCING ELECTRON BEAM DIFFRACTION PATTERNS

This is a continuation of copending application Ser. No. 145,003, filed on Apr. 29, 1980, abandoned.

FIELD OF THE INVENTION

The invention relates to a method of producing electron beam diffraction patterns in which an object to be examined is irradiated by an electron beam and the electrons of the electron beam, diffracted by the object, are imaged by means of an integrating image device or an integrating image material, particularly a photographic layer, the examined object being one which is liable to be substantially altered by the electron beam, when that beam is accelerated by a pre-determined voltage to the energy density necessary to produce an image.

The invention also relates to an apparatus for carrying out the method mentioned above, the apparatus comprising an electron beam device for producing a focussed electron beam, an object slide for locating the object to be examined in the path of the focussed electron beam in a plane running transversely, particularly perpendicularly, to the electron beam, and an integrating image device or an integrating image material, particularly a photographic layer, for imaging the electrons of the electron beam, diffracted by the object, the focussed electron beam and the object being movable relative to each other and/or the apparatus comprising an electrically controllable electron beam interruption or swing-out device.

BACKGROUND OF THE INVENTION

It has been known for a long time to produce electron beam diffraction patterns to determine the structure of crystals or polycrystalline material. The interferences which occur when electron beams pass through crystals or through polycrystalline materials or are reflected in crystals, particularly Laue interferences in monocrystals and Debye-Scherrer rings in polycrystalline materials, allow more exact conclusions concerning the structural composition of the examined materials.

Whereas the examination of the structure of inorganic, particularly mineral materials, using electron beam diffraction patterns has produced genuine results concerning the crystalline structure of these materials, particular difficulties have arisen in this respect during the examination by electron beam diffraction of the structure of organic and biological substances or, generally speaking, during the examination of natural and synthetic materials which have a periodic structure and which are relatively sensitive and have a relatively poor heat-conductivity. This is because considerable structural changes occur as a result of irradiating these substances with electrons of the energy densities necessary to produce an image. These structural changes are referred to below as beam damage. Much has been written in technological literature about undesired structural changes of this type, particularly by L. Reimer in the periodical "Lab. Invest." 14, 1082 (1965), by K. Stenn and G. F. Bahr in the periodical "J. Ultrastruct. Res." 31, 526 (1970), by R. M. Glaeser in the book "Physical Aspects of Electron Microscopy and Microbeam Analysis", page 205, published by Wiley and Sons New York 1975, and edited by B. M. Siegel and D. R. Beaman, and by W. Baumeister, M. Hahn and U. P. Fringeli in "Zeitschrift für Naturforschung" 31c 746 (1976).

As has been experimentally established by G. Siegel in "Zeitschrift für Naturforschung" 27a, 325 (1972), the crystalline arrangement of a paraffin crystal is considerably altered at a current density of the electron beam of 8 electrons per square Angström at an accelerating voltage of the electron beam of 100 kV. Similar experiments in adenosine crystals, which R. M. Glaeser described in the periodical "J. Ultrastruct. Res." 36, 466 (1971), have shown that the crystalline arrangement of an adenosine crystal is almost completely destroyed at a current density of the electron beam of 6 electrons per square Ångström at an accelerating voltage of 80 kV.

The problem arising in respect of these results in the production of electron beam diffraction patterns using photographic films becomes clear when it is considered that a current density of one electron per $\mu m^2$ is necessary to blacken a photographic film using electrons. This means that with a resolution of 5 Ångström, which corresponds to a magnification $\times 100,000$, it is necessary to irradiate the object, i.e., the organic or biological substance which is to be examined, with 100 electrons per square Ångström when the primary electron beam has a diameter in the order of 1 $\mu m$ in the object plane.

Because of this problem it has hitherto been impossible to obtain electron beam diffraction patterns except for relatively insensitive substances, without producing noticeable changes of the original structure of the substances. Thus, as a result of the previously mentioned beam damage, experiments involving examining sensitive substances by means of electron beam diffraction patterns do not allow precise conclusions concerning the original unchanged structure of those substances.

Since the undesired structural changes are attributable to the fact that the energy which is supplied to the examined organic and biological substances by the electron beam cannot be dissipated to the surroundings fast enough by these substances, there is a possibility of obtaining electron beam diffraction patterns of these sensitive substances by a method involving cooling the substances to a very low temperature during their examination, that is to a temperature of 4° K. using liquid helium. Such a method, using a 400 kV-electron microscope comprising a superconductive objective lens, has developed by the laboratory of Siemens AG, Munich and has been reported by J. Dietrich, F. Fox, E. Knapek, G. Lefrane, R. Nachtrieb R. Weyl and H. Zerbst in the periodical "Ultramicroscopy" 2, 241 (1977). However, for this purpose a high degree of technical complexity is required.

SUMMARY OF THE INVENTION

An object of the present invention is to provide a method and an apparatus for producing electron beam diffraction patterns, wherein sensitive natural and synthetic materials having a periodic structure, particularly organic and biological substances, can be examined without substantial beam damage occurring, and by means of which, therefore, the original structure of the examined substances are substantially unchanged, so that the electron beam diffraction patterns allow reliable conclusions concerning the genuine structure of these substances. It is a further object of the invention to provide a method and apparatus for examining sensitive materials by electron beam diffraction, avoiding the use of very low temperature cooling of the examined object.

According to the invention there is provided a method of producing electron beam diffraction patterns, in which an object to be examined is irradiated by means of an electron beam and the electrons of the electron beam, diffracted by the object, are imaged using an integrating image apparatus or an integrating image material, the object being examined being one which is liable to be substantially altered by an electron beam when that beam is accelerated to a pre-determined voltage to the energy density which is necessary for the production of an image, wherein at least one region of the object corresponding in size to the cross section of the electron beam is irradiated intermittently using an electron beam accelerated by the pre-determined voltage, which electron beam has an electron density which is lower than that at which the object is substantially altered, and wherein irradiation is carried out for such a period of time that the electron density of the electron beam, integrated during this time, is at least equal to the electron density necessary to produce an image.

Expressed in simple terms, in the method of the invention the sensitive object is not irradiated for a short period of time, as is the conventional practice, but is irradiated intermittently over a period of a few hours at one or more points by an electron beam of very low beam current density. As a result of this, the electron energy required to produce an image of the diffracted electron beam is acquired during the course of time.

According to a preferred embodiment of the method of the invention, a pre-determined continuous surface of the object is scanned once or a plurality of times with the electron beam, the electron beam being allowed to pass in a pre-determined pattern over the continuous surface of the object. The intermittent irradiation is therefore achieved in this case by virtue of the fact that the electron beam scans successive individual points of the surface and optionally returns once or a plurality of times to the individual points. By this scanning method, the object can be scanned in a surface-covering manner by the electron beam.

Although a wide variety of scanning patterns can be used, for example a spiral-form scanning, or a scanning consisting of concentric circles, squares or rectangles, the method of the invention is preferably implemented by allowing the electron beam to pass over the continuous surface of the object in a meandering or continuous raster pattern. This takes advantage of the fact that conventional object slides are displaceable in two directions perpendicular to each other, and also avoids any need to interrupt the electron beam during irradiation.

In principle, scanning the object using the electron beam can be effected by allowing electron beam to travel and keeping the object stationary or by keeping the electron beam stationary and allowing the object to move. In available electron microscopes generally used to produce electron beam diffraction patterns, considerable modification would be necessary to allow the beam to travel, and it is preferred to implement the method of the invention by moving the object through a stationary electron beam in pre-determined preferably meandering pattern, transversely preferably perpendicularly to the electron beam.

In all commercial electron microscopes there is the possibility of moving the object by adjusting the microscope stage and this is effected using two manual spindles in two directions perpendicular to each other. In a meandering scanning, one spindle of the microscope stage adjustment is passed from one adjusted stop to another adjusted stop and is halted there. Then the other spindle performs a defined longitudinal step and then the first spindle is rotated in the reverse rotational direction to such an extent that the microscope state returns to the starting point. This procedure is continued until the other spindle which performs the small movement steps, has itself reached its pre-adjusted final position. Here, the rotational direction of this other spindle is immediately reversed and the total scanning procedure now returns, as just described, but in the opposite direction. The privileged direction of scanning, i.e. the direction in which the longer paths of the meandering pattern run, can be rotated through 90° C. if required, for which purpose the spindle drives of the microscope stage adjustment are easily exchanged. This is easily possible due to their similar construction.

However, the method of the invention can also be implemented by keeping the object and the electron beam stationary relative to each other and periodically interrupting the impingement of the electron beam on one and the same point of the object. For this purpose, the electron beam is preferably periodically swing out of the region of the object, which can be easily effected in any commercially available electron microscope, as electron microscopes generally have an electrically controllable swing-out mechanism for the electron beam.

An apparatus for implementing the method involving relative movement between the object to be examined and the focussed electron beam, has an adjusting device which enables a pre-determined continuous surface of the object to be scanned once or a plurality of times with the electron beam, which device allows the electron beam to pass over the continuous surface in a pre-determined pattern.

The adjusting device is preferably such as to allow the electron beam to travel over the surface in the meandering pattern mentioned above.

If it is intended to move the object slide and keep the electron beam stationary, the apparatus comprises an object slide adjusting device for moving the object slide in a transverse, particularly perpendicular, movement plane relative to the focussed electron beam. This object slide adjusting device comprises, as indicated above a first shaft, as a result of the rotation of which the object slide is adjustable in the movement plane via a first driving connection in a first coordinate direction, for example in the x-direction, and also a second shaft, as a result of the rotation of which the object slide is adjustable in the movement plane via a second driving connection in a second coordinate direction, for example the y-direction. A first driving device is coupled to the first shaft to drive the first shaft automatically and a second driving device is coupled to the second shaft to drive the second shaft automatically. A first sensor device is coupled to the first shaft to determine the respective position of the object slide in the first coordinate direction and a second sensor device is coupled to the second shaft to determine the respective position of the object slide in the second coordinate direction. A control device is connected to both the driving and sensor devices to effect programmed control of both driving devices dependent on signals from both sensor devices.

The driving devices can each comprise an electromotor which is coupled to the respective shaft of the object slide adjusting device via a gear and a slip friction clutch.

The electromotor can also be coupled to a tacho-generator and, together with this generator, it can be connected to a motor control circuit keeping the velocity or the electromotor constant and switching over the direction of rotation of the electromotor.

To enable the object slide to be occasionally adjusted manually if required, although however the adjustment caused thereby is perceived by the sensor device, the driving devices can be decoupled from the respective shaft independent of the sensor devices.

An apparatus to implement the method of the invention in which the electron beam and the object to be examined are maintained stationary relative to each other, comprises an electrically controllable electron beam interruption or swing-out device, and further comprises an interval tracing circuit, coupled to the electron beam interruption-or swing-out device, for periodically interrupting or swinging the focussed electron beam out of the region of the object. The interval tracing circuit comprises a first control circuit for adjusting the length of time of the interruption-or swing-out period during which the focussed electron beam is respectively interrupted or swun out, and a second control circuit for adjusting the length of time of the irradiation period, during which a pre-determined point of the object is irradiated by the focussed electron beam. In this manner, the swing-in time of the electron beam or the irradiation time and the swing-out time of the electron beam (the dark or recovery time) are adjustable in wide limits independent of each other and their total determines the period duration of scanning a pre-determined point of the object using the electron beam.

In the two basic embodiments of the apparatus of the invention described above, i.e. the embodiment in which a relative movement between object and electron beam takes place, and the embodiment in which object and electron beam are maintained stationary to each other, it is possible to provide a timewise controlled disconnection device, coupled to the electron beam device and also to the control device or to the interval tracing circuit, to interrupt the focussed electron beam or to swing the beam out of the region of the object and optionally to disconnect the driving devices.

BRIEF DESCRIPTION OF THE PREFERRED EMBODIMENTS

The advantages and features of the invention mentioned above and also other advantages and features are explained in the following in more detail with reference to the accompanying drawings, in which.

DETAILED DESCRIPTION OF PREFERRED EMBODIMENTS

Figure 1:
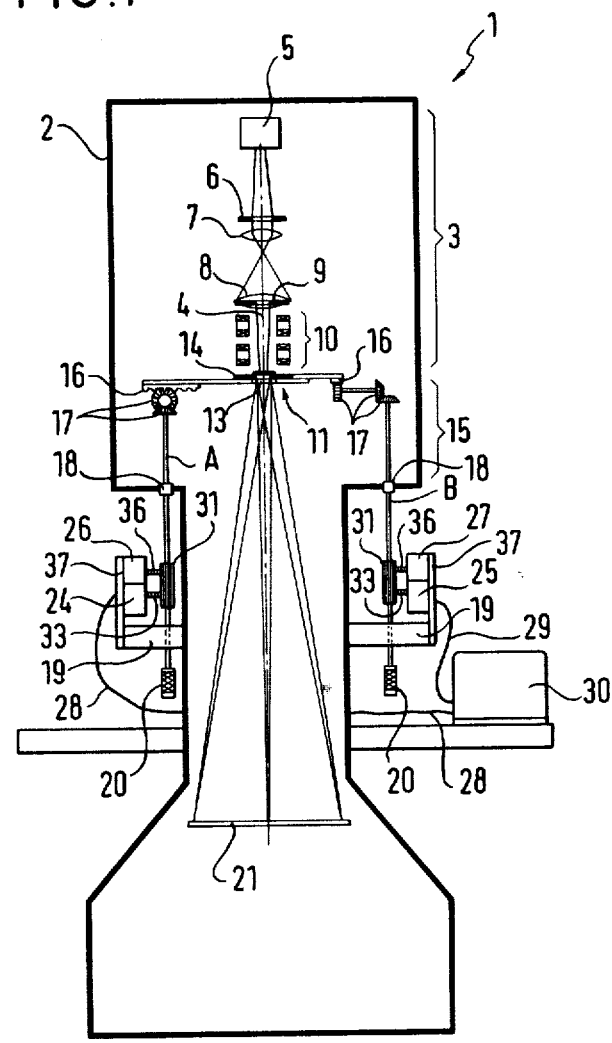
FIG. 1 is a schematic illustration of an electron microscope involving a particularly preferred embodiment of the apparatus according to the invention, whereby the method of the invention can be implemented to produce electron beam diffraction patterns.

FIG. 1 shows a conventional electron microscope 1 which is generally used with a corresponding beam path for diffraction, while the imaging lenses are disconnected to produce electron beam diffraction patterns. The upper part of the microscope comprises a casing 2 which can be evacuated. Within the casing is an electron beam device 3 for producing a focussed electron beam 4.

The electron beam device 3 substantially includes, in conventional manner, an electron source 5, a pin diaphragm-form anode 6, a first condenser 7, a second condenser 8, a diaphragm 9 provided in the region of the second condenser 8, and a deflecting system 10.

It should be noted at this point that the electron beam system of an electron microscope does not necessarily have to be used as the electron beam device 3, but that in principle any other electron beam device is suitable provided it allows the production of a focussed electron beam having a low beam current density of less than a few electrons per square Ångström at accelerating voltages of 50 kV and more, preferably beam current densities of less than one electron per square Åugström. Beam current densities of less than 0.1 electron per square Ångström are particularly preferred, for example a beam current density of $2.5 \times 10^{-2}$ electrons per Ångström square.

Figure 8:
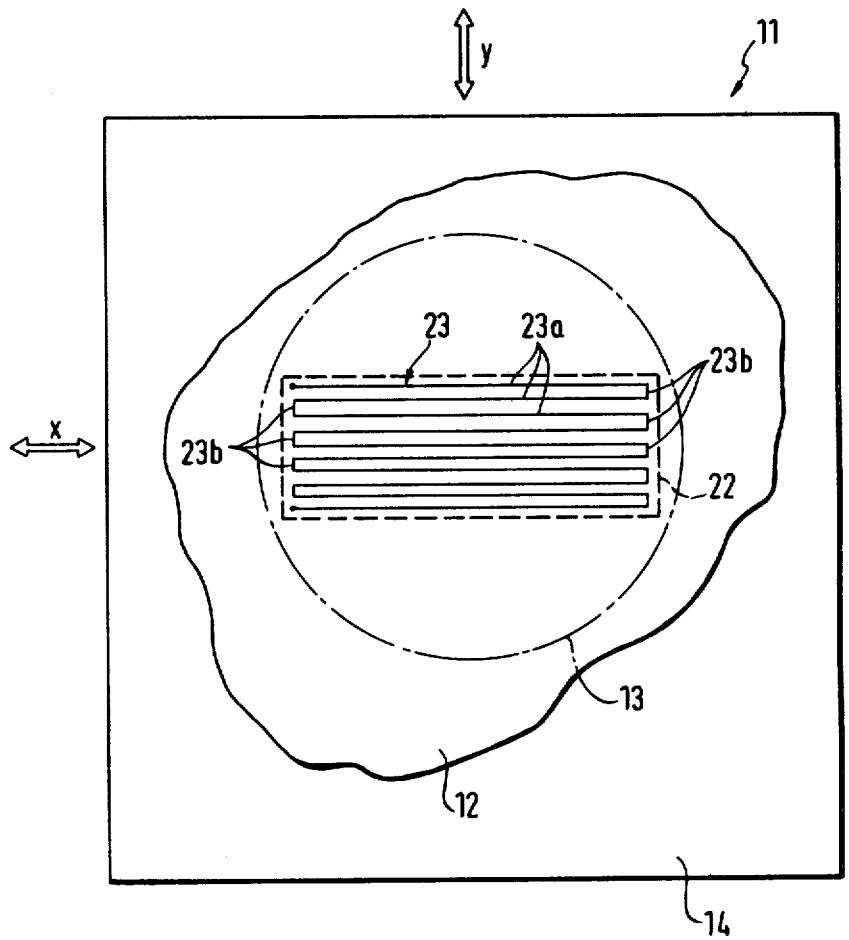
FIG. 8 is a schematic illustration of a top plan view of the object and the scanning path of a meandering scanning of the object using an electron beam.

The apparatus shown in FIG. 1 also comprises an object slide 11 as is usually used in electron microscopes. This object slide 11, on which the object 12 to be examined (see also FIG. 8) is located over an opening 13 through which the electrons diffracted by the object 12 can pass, comprises a microscope stage 14 which is movable in a plane running transversely, preferably perpendicularly, to the electron beam 4. This plane is the plane of the drawing in FIG. 8.

In order to move the object slide 11 or the microscope stage 14, an object slide adjusting device 15 is provided. The device 15 comprises a first shaft A, as a result of the rotation of which the microscope stage 14 is adjustable in the movement plane in a first coordinate direction, namely in the x-direction (see FIG. 8). The object slide adjusting device 15 also comprises a second shaft B, as a result of the rotation of which the microscope stage 14 is adjustable in the movement plane in a second coordinate direction, which is preferably perpendicular to the first coordinate direction, namely in the y-direction (see FIG. 8). The first and second shafts A and B are referred to below as microscope stage adjusting spindles or more shortly, as spindles.

The shafts A and B are each connected to the object slide 11 via a driving connection formed in conventional manner, whereby each of these driving connections substantially comprises a rack 16 and toothed wheels 17 by which the rotational movement of both shafts A and B is transformed into a translation movement of the microscope stage 14. The shafts A and B are guided through the casing 2 by means of vacuum-tight glands 18 to the outside and are there mounted in bearing brackets 19 and can be turned manually by handles 20.

At a suitable distance beneath the microscope stage 14, there is an integrating image device or an integrating image material 21, preferably in the form of a photographic film or a photographic plate, upon which an electron beam diffraction pattern is produced using the electrons of the electron beam 4 diffracted by the object 12.

In order for the microscope stage 14 to be adjusted automatically so that a continuous surface 22 (see FIG. 8) is scanned once or a plurality of times by the electron beam 4 in a meandering pattern 23, a first driving device 24 is coupled to the first shaft A, which drives this shaft automatically. Correspondingly, a second driving device 25 is coupled to the second shaft B to drive this shaft automatically. There is also a first sensor device 26 coupled to the first shaft A to determine the respective position of the microscope stage 14 in the x-direction, and a second sensor device 27 coupled to the second shaft B to determine the respective position of the object slide in the y-direction. These sensor devices 26 and 27 can for example be mechanical registers, their reading values respectively stating the position of the microscope stage 14, based on an arbitrary origin, in the x-direction and the y-direction.

There is also a control device 30 connected to both the driving and sensor devices 24, 25 and 26, 27 via electrical circuits 28 and 29 (the first circuit is partially obscured in FIG. 1 because it passes behind the casing 2), to effect programmed control of the driving devices 24 and 25 dependent on signals from the sensor devices 26 and 27.

Figure 2:
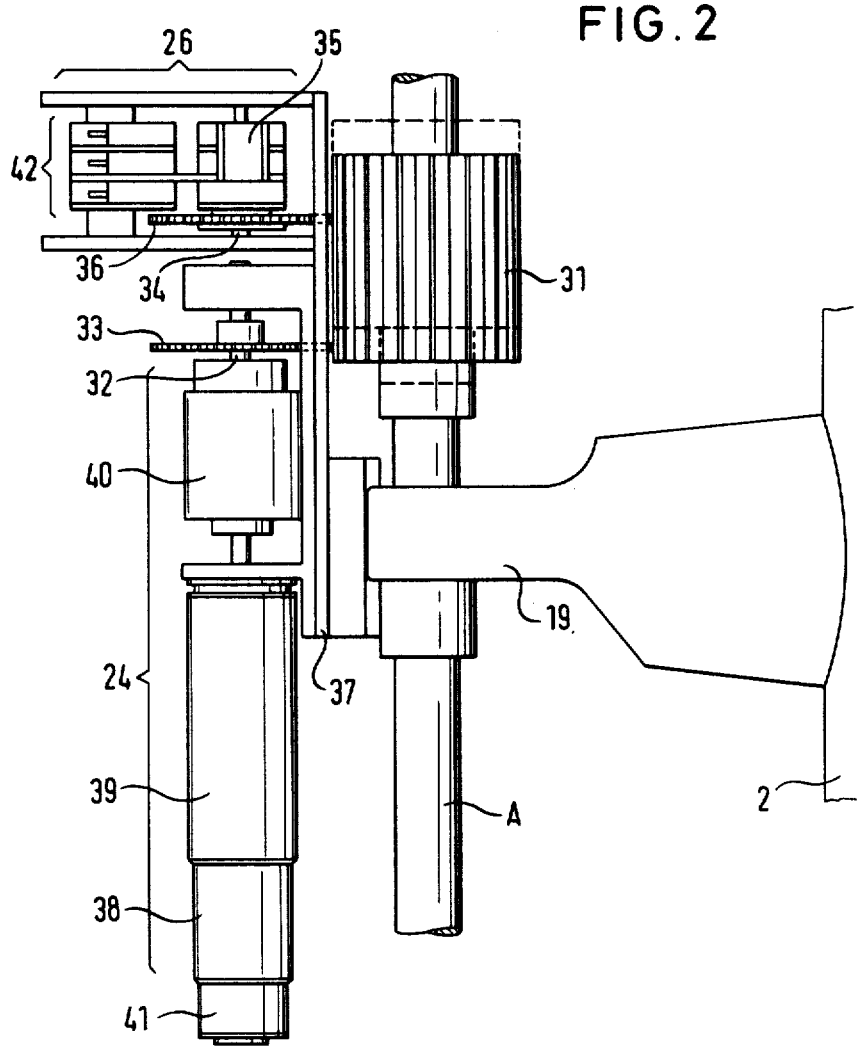
FIG. 2 is a lateral front view of a driving and sensor device coupled to a shaft of an object adjusting device of the electron microscope.

As can be seen from FIG. 1, but more clearly from FIG. 2, a respective axially extending pinion 31 is attached in a rotation-fast manner the shafts A and B to couple the driving devices 24, 25 and the sensor devices 26, 27. A driving toothed wheel 33 positioned in a rotation-fast manner on the output shaft 32 of the driving device 24 or 25 cooperates with this pinion. Correspondingly, a toothed wheel 36 positioned in a rotation-fast manner on the input shaft 34 of the mechanical register 35 of the relevant sensor device 26 or 27 respectively cooperates with the same pinion 31.

The pinion 31 is displaceable in the axial direction of shaft A or B, to such an extent, as is indicated in FIG. 2 by dashed lines, that the driving toothed wheel 33 can be brought into a non-meshing position with the pinion 31, but the toothed wheel 36 still remains in a meshing position with the pinion 31. The result of this is that the relation between the rotating position of shafts A and B or between the position of the microscope stage 14 and the revolution counters 35 of the sensor devices 26 and 27 is always achieved if the shafts A and B are adjusted manually using the handles 20 and the driving devices 24 and 25 are unoperated.

The driving and sensor devices for both shafts A and B are constructed identically so that it will suffice to explain the structure of the driving and sensor device for shaft A using FIG. 2. The driving device 24 or 25 and the relevant sensor device 26 or 27 are located on a common frame 37 which is attachable to the respective bearing bracket 19 of the shaft A or B by means of screws, which are not shown, so that the apparatus according to the invention can be installed by simple assembly on to an available electron microscope without necessitating substantial constructional modification to the electron microscope.

Each of two driving devices 24 and 25 comprises an electromotor 38 which is connected to the output shaft 32 via a step-down gear 39 and a slip friction clutch 40. A tacho-generator 41 is also fitted on to the electromotor 38 to control the rotational speed.

In order to achieve a continuous movement, a direct current motor is preferably used as the electromotor 38, which has a particular advantage over a steping motor in that its drive requires slightly less expensive electronic circuitry. In an exemplary case, a motor having a nominal voltage of 4.5 V and a nominal speed of 6000 rotations/min was selected. Since the speed variation required in this case was 7:30 which is relatively high, a speed control of the electromotor 38 was provided via the tacho-generator 41. The tachogenerator 41 had an output voltage of 1.4 V/1000 rotation/minute. For the gear, there was used one having a gear reduction of 54.6:1. With the nominal speed of the electromotor 38 to 6000 rotations/min and the selected gear, the rotational speed of the shafts A and B was 110 rotations/min. However, only rotational speed s of the shafts A and B of 20/0.33=60 rotations per minute should be achieved. Consequently, the electromotor 38 was only run at half the nominal speed, so that sufficient acceleration and power reserves are available. The acceleration constant of the electromotor 38 using the tacho-generator 41 was 20 ms and was therefore neglibile.

The slip friction clutch 40 between the electromotor 38 or the step-down gear 39 on one side and the driving toothed wheel 32 is used to prevent damage in case a mechanical stoppage occurs as a result of a malfunction.

It should also be mentioned that the pinion 31 on the shafts A and B must be run out sufficiently long because the shafts move up and down when they rotate.

The sensor devices 26 and 27 each comprise a reflection light barrier arrangement 42 and a mechanical revolution counter 35. This reflection light barrier arrangement 42 is actuated by the revolution counter 35 in the manner described below following and transmits control signals to the control device 30 as a result of which electro motor 38 is controlled as is described in more detail below with reference to FIGS. 4 and 6.

In one embodiment, the revolution counter 35 was a three-figure register of the type provided for example in tape recorders for counting the length of the tape; a revolution counter of this type has a resolution of 1/10 revolution. Corresponding to the three-figure revolution counter 35, the reflection light barrier apparatus 42 comprises three reflection light barriers which are operated upon two pre-determined reading values of the revolution counter 35 and respectively switch over the direction of rotation of the electromotor 38 via the control device 30 so that the electromotor 38 therefore always turns the coupled shaft A or B to and fro between two rotational positions determined by the predetermined reading values of the revolution counter 35. For example, reflecting elements, e.g. circular white discs of 4 mm in diameter can be positioned on the counting discs 43 A, 44 A and 45 A of the revolution counter 35 for shaft A (see FIG. 6) and also on the counting discs 43 B, 44 B and 45 B of the revolution counter 35 for shaft B in the positions 00.0 and 20.0 on the circumference of these counting discs, while the remaining part of the circumference of these counting discs can be blackened. These reflecting elements 46 which have been drawn in exaggerated form in FIG. 6 for clarity of illustration, operate the relevant three reflection light barriers of the respective reflection light barrier arrangement 42 in a manner which is described in more detail below, and emit corresponding electrical control signals. If the three reflection light barriers of the sensor device 26 simultaneously register three reflecting elements 46 for the shaft A, then their movement is stopped and the shaft B is initiated to perform a timewise limited rotation. If then the three reflection light barriers of the reflection light barrier arrangement 42 belonging to shaft B simultaneously register three reflecting elements 46, then shaft B is stopped and its direction of rotation is immediately reversed.

Figure 4:
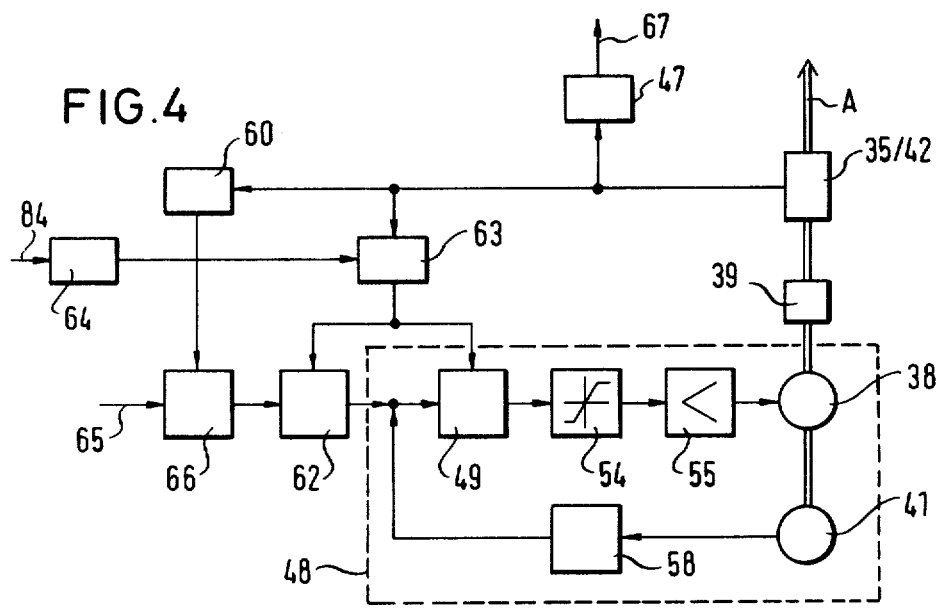
FIG. 4 is a block circuit diagram of a motor regulation-and control circuit for one of the two shafts of the object adjusting device for the object slide of an electron microscope.

The block circuit diagram shown in FIG. 4 will now be discussed in detail. FIG. 4 only shows the regulation and control circuit for shaft A, which runs continuously from stop to stop, i.e. operates the longer path distances 23a of the meandering movement (see FIG. 8). The regulation and control circuit for shaft B which operates shorter distances 23b of the meandering movement, is in principle, constructed identically.

Figure 5:
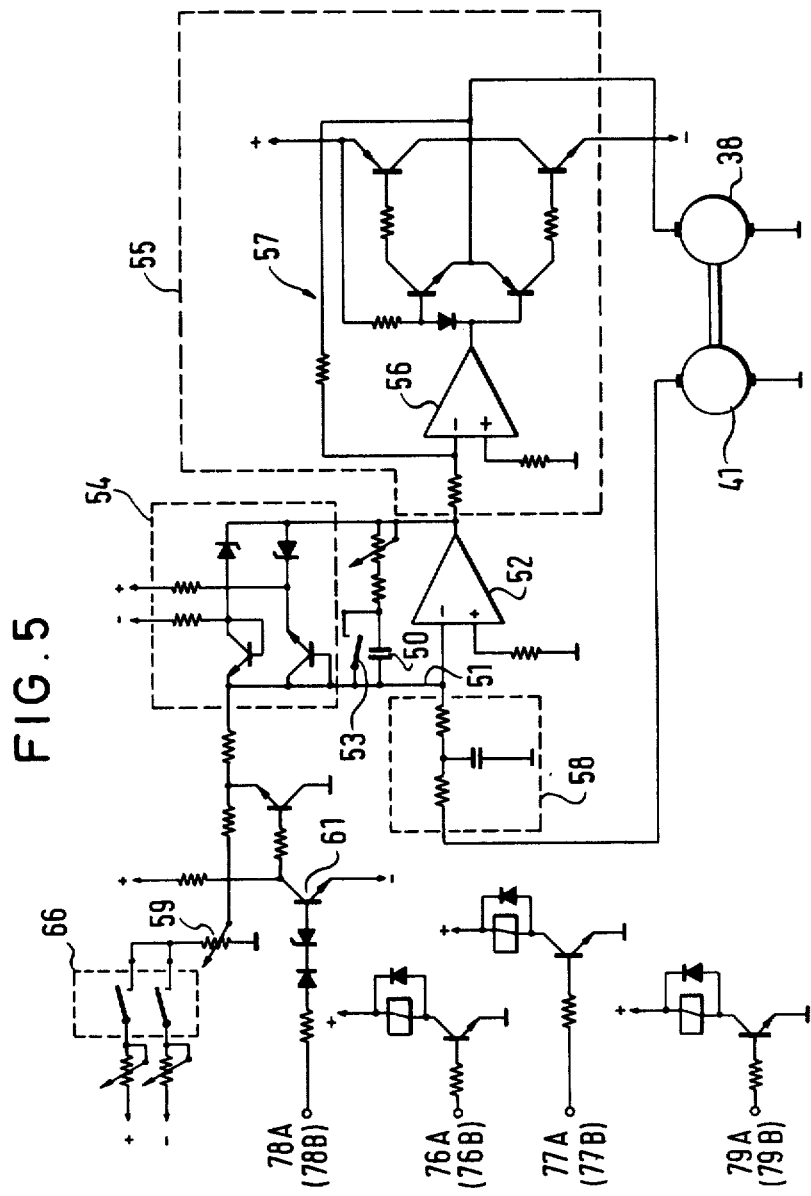
FIG. 5 is a circuit diagram showing more detail of the regulation of the rotational velocity of the electromotor of the driving device according to FIG. 2.

A timing element 47, which is triggered by the revolution counter 35 of shaft A gives the duration for the respective operation of shaft B. A control system 48 for maintaining the rotational velocity of the motor 38 constant comprises a proportional-integral-controller 49 which is also referred to below as a PI-controller, and whose integral part, which is formed by a capacitor 50 (see FIG. 5) in a feedback circuit 51 of the control amplifier 52, is short-circuited when resting (by the switch 53 in FIG. 5), to prevent very small offset-voltages (i.e. input error voltages) of the control amplifier 52 from starting the electromotor 38. The controlled quantity substantially achieves the supply voltage-potential with a large nominal-actual value deviation at the output of the controller. To avoid this overloading the electromotor 38, a limiting circuit 54 for the motor operating voltage is provided in the feedback of the control amplifier 52. A power amplifier 55 is connected before the electromotor 38. This power amplifier 55, as shown in FIG. 5, consists of an integrated operational amplifier 56 followed by transistor power stage 57.

Figure 6:
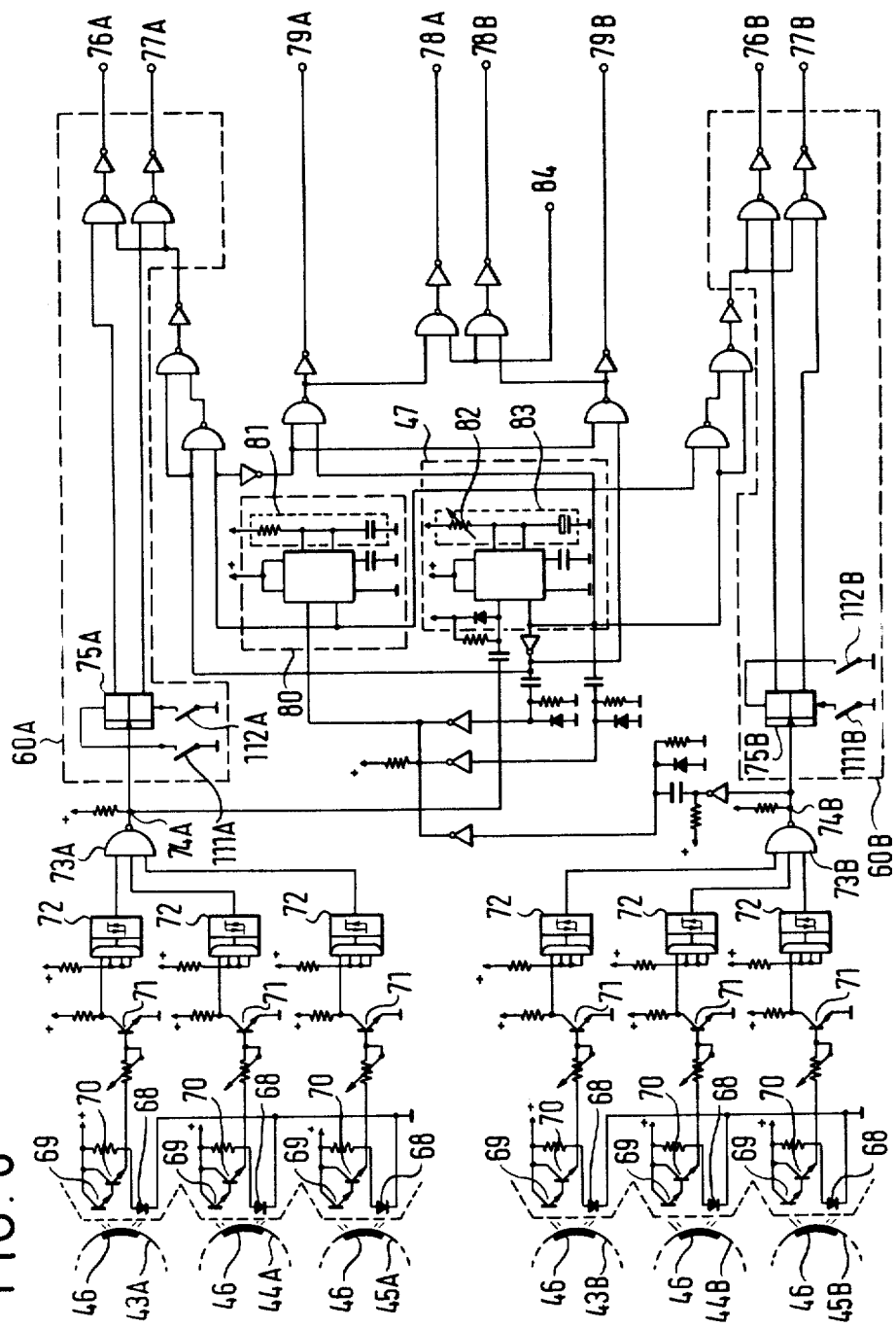
FIG. 6 shows a more detailed embodiment of a circuit for the control of both driving devices for both shafts of an object slide adjusting device.

Since the voltage emitted by the tachogenerator 41 pulsates corresponding to the internal number of poles and the speed of the tachogenerator, the voltage has to be smoothed by means of a low-pass filter 58 which preferably has a time constant of 10 ms, before the control difference of the nominal-value is formed in the control amplifier 52. The nominal value for rotational velocity is adjusted via a potentiometer 59. The potentiometer 59 is supplied with a voltage whose polarity is determined by a rotational direction logic 60. In FIG. 6, the rotational direction logic for shaft A is marked 60A and the rotational direction logic for shaft B is marked 60B. Attention is directed at this point to the fact that if A or B is respectively added to a reference numeral this signifies that this is a component or a unit which is provided to operate shaft A or B, although this addition, as can be seen from the preceding description, is not provided in the cases in which a distinction is not necessarily required. The disconnection for the standstill is effected using a chopper transistor 61 having a very low residual voltage.

FIG. 4 shows that between the output of the revolution counter 35 and the input of the timing element 47 on the one hand and the PI-controller 49 and disconnection device 62 for the standstill of the electromotor 38 on the other hand, there is provided an interlocking logic 63 which is also connected to a time disconnecting device 64. A preferred embodiment of the device 64 is shown in detail in the left part of FIG. 7. The nominal value-input for the speed of the electromotor 38 is effected at 65, via a pole reversal circuit 66 (also see FIG. 5). A line passes at 67 to the regulation and control circuit for shaft B.

The regulation and control circuit for shaft A, shown in FIG. 4, functions so that when the revolution counter 35 has reached one of the two pre-determined reading values, a signal from the allocated reflection light barrier arrangement 42 is transmitted to the interlocking logic 63 which thereupon stops the electromotor 38 via the disconnection device 62 and the PI-controller 49. This signal passes simultaneously to the rotational direction logic 60 so that it reverses the direction of rotation of the electromotor 38 via the pole reversal circuit 66. This signal also passes to the timing element 47 whence it is transmitted to the regulation and control circuit for shaft B via the line 67, where it causes a pre-determined rotational step of shaft B, which corresponds to a short path course 23b (see FIG. 8) of the meandering path 23. When this step has been performed, the motor 38 can effect another new longer path course 23a via shaft A.

Attention is directed here to the fact that FIG. 4 represents a basic block circuit diagram, whereby FIGS. 5 and 6 illustrate more detailed circuitry including means for the production of breaking signals (not shown in FIG. 4), from which certain deviations are produced.

The more detailed embodiment of a control circuit and its function will now be explained with reference to FIG. 5 and FIG. 6.

As has already been described above, the reflection light barriers distinguish reflecting elements 46, for example white circles, on a dark base. For this purpose, each of the reflection light barriers comprises a light emitting diode 68 which throws infrared light on the circumference of the black counting disc 43A, 43B or 44A, 44B or 45A, 45B which is allocated thereto. A respective phototransistor 69 is positioned suitably for each light-emitting diode 68, each phototransistor 69 being connected to a second transistor 70 to form a current-amplifying Darlington Pair. The phototransistor does not receive a signal when the black circumference surface of the counting disc absorbs the infrared light, and it does receive an infrared light signal when this is reflected by a reflecting element 46. For this purpose, each light-emitting diode 68 and its corresponding phototransistor 69 are positioned at an angle to one another, at the point of intersection of which the circumferential surface of the relevant counting disc is located. Achieving a good discrimination depends on the blank circumferential surface of the counting discs effectively absorbing the infrared light, for which purpose the surface can be coated, for example with photoresist, and on the reflection elements 46 reflecting effectively.

A switching transistor 71 and a Schmitt-trigger 72 form an exact logic 0 to logic 1 transistion, from the current changes caused by the respective phototransistor 69. Three of these light barriers each belong to a revolution counter whose logic signals are connected to a NAND-gate 73A or 73B. If three reflecting elements 46 appear simultaneously this corresponds, as already explained above, to one of the two pre-determined reading values of the revolution counter 35 for the shaft A or shaft B. Consequently, a voltage jump from logic 1 (approximately 5 V), to logic 0 (approximately 0 V) occurs at the output of the NAND-gate 73A or 73B when the relevant revolution counter 39 has reached one of the two pre-determined reading values. This output 74A or 74B is simultaneously the input of the corresponding rotational direction logic 60A or 60B. As a result of the above mentioned voltage jump, the flip-flop 75A or 75B present at the input of the rotational direction logic is switched over, whereby a signal is emitted via the outputs 76A, 77A or 76B, 77B of the rotational direction logic 60A or 60B, which signal causes a change in the direction of rotation of the relevant electromotor 38 for the shaft A or shaft B.

Simultaneously, when the above mentioned voltage jump occurs at the output 74A, the timing element 47 also connected to this output is activated, which determines the respective operating time of shaft B, so that the electromotor 38 performs a defined rotation of, for example 27°, for shaft B. This corresponds to a short distance 23b (see FIG. 8) of the meandering path 23. Meanwhile, at output 78A at which a start or stop signal for the electromotor appears which drives shaft A, a signal stopping the electromotor is present. The signal which causes the electromotor to operate the electromotor driving shaft B appears at output 78B which is the start and stop output for this electromotor.

There is also a second timing element 80 connected behind the first timing element 47 which emits a delayed braking signal at the output 79A and 79B. A braking signal for the electromotor 38 is emitted at the output 79A at a given time, which electromotor drives shaft A, while at output 79B at a given time, a braking signal for the electromotor 38 appears which motor drives shaft B. These braking signals appear at a certain time interval of for example 5 ms delayed with respect to the start or stop signals at the outputs 78A or 78B and are used to avoid overlaps between the starting up and braking of shafts A and B which could occur as a result of relay delays. For this purpose the signals at the outputs 78A, 78B and 79A, 79B correspond to each other in the following manner:

1. When the electromotor receives a starting signal for the shaft A via the output 78A, then the electromotor receives a braking signal for shaft B via the output 79B, whereby the starting signal at the output 78A, during the appearance of which the electromotor runs for shaft A, is delayed by approximately 5 ms, so that the electromotor only then starts up for shaft A when the electromotor which drives the shaft B is actually braked or has stopped. This applies correspondingly for a starting signal at the output 78B and for a braking signal at the output 79A.

2. When the electromotor which drives the shaft B is to operate, i.e. a starting signal appears at output 78B, then this starting signal is delayed by approximately 5 ms with respect to the disconnection of the braking signal which appears at the output 79B, in order to ensure that this braking signal for the motor allocated to shaft B has disappeared when the starting signal for this motor appears at output 78B. This applies correspondingly for the starting signal at output 78A and for the braking signal at output 79A for the electromotor which drives shaft A.

The previously mentioned delay time of, for example, 5 ms is fixedly adjusted by the RC-section 81 which is provided in the timing element 80. The operating time of the rotating step which shaft B executes and which corresponds to a short distance 23b (see FIG. 8) of the meandering path 23 can be adjusted to a required value by the potentiometer 82 of the RC-section 83 which is provided in the timing element 47.

The outputs 76A, 77A, 78A and 79A are connected to the inputs (which are marked identically in FIG. 5) of the motor control and regulating circuit for the electromotor which drives shaft A. Correspondingly, the outputs 76B 77B, 78B and 79B are connected to the corresponding, identically marked inputs of a second motor control and regulation circuit of the type shown in FIG. 5, and these inputs are so labelled in FIG. 5 in brackets.

Figure 7:
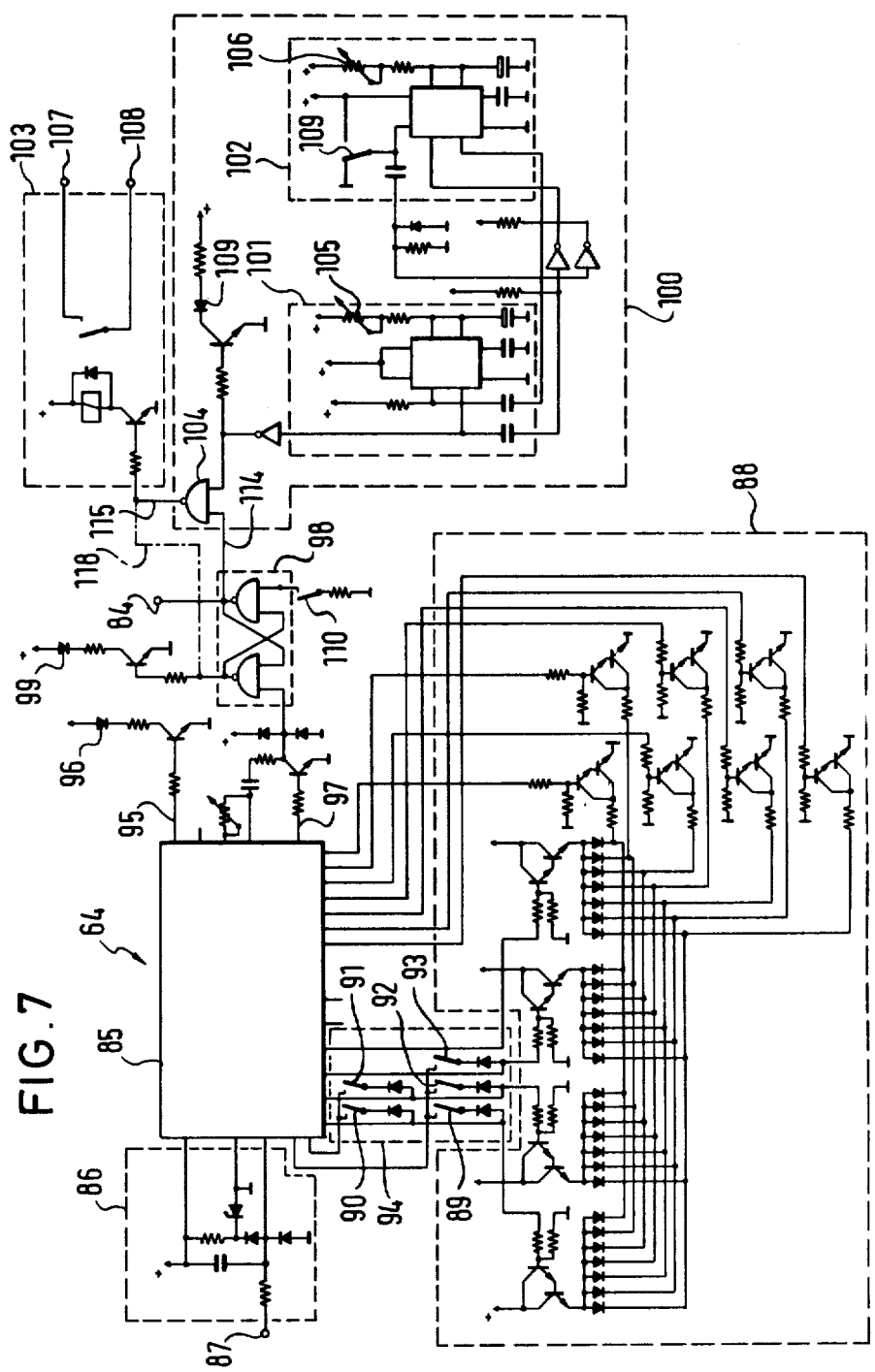
FIG. 7 is a circuit diagram of a timewise controlled disconnection device and an interval tracing circuit for periodically swinging the focussed electron beam out of the region of the object to be examined.

The circuit according to FIG. 6 also has an input 84 (see also FIG. 4), via into which a disconnection signal may be entered as a result of which the electromotors 38 for both shafts A and B are automatically disconnected after a pre-determined time of, for example, 2 hours has passed, after which the irradiation of the object should stop. This disconnection signal is received at the output, also marked by 84, of the time disconnection device 64, an embodiment of which is shown in FIG. 7. Some other form of time disconnection device 64 can be used provided it is a circuit or a device which releases a disconnection signal to a disconnection signal output, which in the present case is output 84, at a pre-adjustable time.

The time disconnection device 64 shown in the left part of FIG. 7, is particularly constructed having a pre-adjustable "waking time" by using an integrated electronic clock circuit 85, to which "waking time" a time base input circuit 86 is connected which is supplied with the mains frequency of 50 Hz at the time base input 87 as a time base via a secondary winding (not shown) of a mains transformer. On the front panel of the control device 30 (see FIG. 1), both the operating time as well as the "waking time" can be alternately shown via a corresponding indicator (not shown). For the purpose of such a time indication, a time indication circuit 88 is connected to the clock circuit 85, which time indication circuit 88 is connected via switches 89 to 93 of an operating device 94 to the clock circuit 85. The way these switches operate is explained in more detail below.

A seconds clock signal appears at the output 95 of the clock circuit, by which a light emitting diode 96 is made to light up for control purposes in the seconds clock on the indicating scale for the indication of time. The "waking signal" appears at output 97, which signal is an alternating current signal in the clock circuit used and is made into a duration signal in a subsequently connected RS-flip-flop 98, which duration signal then appears at output 84 as a disconnection signal. When the disconnection signal appears, a light emitting diode 99 is also made to light up which indicates to the operator that the system has been disconnected.

Since the above mentioned disconnection signal, which is introduced into the circuit of FIG. 6 via output 84, only causes a disconnection of the electromotors for shafts A and B, but does not cause the electron beam 4 to swing out of the region of the examined object 12, the disconnection signal is supplied to the beam swing-out control circuit of the electron beam device 3 via the line 99 drawn as a dashed line in FIG. 7, if an interval tracing circuit 100 is not simultaneously provided in the apparatus, as is shown in the right part of FIG. 7, in order to swing out the electron beam.

After the expiration of the given "waking time" and with the adjusted "waking function" of the time disconnection device 64, all functions of the apparatus according to the invention are brought to a standstill or into a resting position.

The interval tracing circuit 100 which can also be characterised as a beam fade-out circuit, and which is used for the intermittent irradiation of object 12 without changing the relative position between the object 12 and the electron beam 4, comprises a first control circuit 101 and a second control circuit 102 which are connected to the beam swing-out control circuit 103 via one input of a NAND-gate 104 whose other input is connected to the output 84 of the RS-flip-flop 98. The control circuits 100 and 102 are two integrated timers connected as monostable toggle stages, which are connected such that they are mutually triggered at the end of their adjusted time at the potentiometers 105 or 106 respectively. The control circuit 101 determines the swing-out time of the electron beam so that this swing-out time can be adjusted using the potentiometer 105, while the control circuit 102 determines the irradiation time and consequently the irradiation time can be adjusted using the potentiometer 106. As a result of the subsequently connected NAND-gate 104, the electron beam remains in the swung-out condition after the disconnection signal has appeared at output 84.

On the front panel of the control device 30 (see FIG. 1), apart from the above mentioned scale (not shown) for the alternative indication of the operating time or the "waking time", a mains switch and sockets for the driving and sensor device 24 to 27 and also for connecting the terminals 107 and 108 (see FIG. 7) to the electron beam device 3, the following operating and indication elements are provided:

1. Adjustment knobs for the potentiometers 105 and 106 for adjusting the electron beam swing-out time and the irradiation time; a light emitting diode 109 (see FIG. 7), which indicates whether the interval tracing circuit 100 is in the irradiation phase, the diode 109 being connected to the output of the interval tracing circuit 100; and an on-off switch 109 (see FIG. 7) for the interval tracing circuit. The light emitting diode 109 only lights up when the beam is swung in and is dark when the beam is swung out. The relatively slow flashing resulting from this process naturally indicates that the interval tracing is connected.

2. The switches 89 to 93, which have the following functions. Upon operating switch 89, the adjusted disconnection time appears on the indication scale of the time disconnection device 84; the switch 90 allows the adjustment of the time; the switch 91 allows adjustment of the hours, the switch 92 allows adjustment of the minute units, and when switches 91 and 92 are operated simultaneously the ten minute units are adjusted; the actual connection is effected by switch 93 because only when this switch is connected can a disconnection signal appear at the output 97 at a programmed time. The light emitting diode 99 is also provided on the front panel which lights up after reaching the pre-adjusted disconnection time. A push button 110 (see FIG. 7) is provided which can reverse the time disconnection via RS-flip-flop 98.

3. Respective adjustment knobs for the potentiometer 59 (see FIG. 5) of the motor control and regulation circuit for the electromotor which drives shaft A and for the electromotor which drives shaft B, whereby the rotational velocity of both electromotors 38 can be adjusted; also key switches 111A, 112A and 111B, 112B (see FIG. 6), which are connected to the flip flops 75A or 75B and by which the direction of rotation of both electromotors for the shafts A and B can be preselected (clockwise or anti-clockwise).

Figure 3:
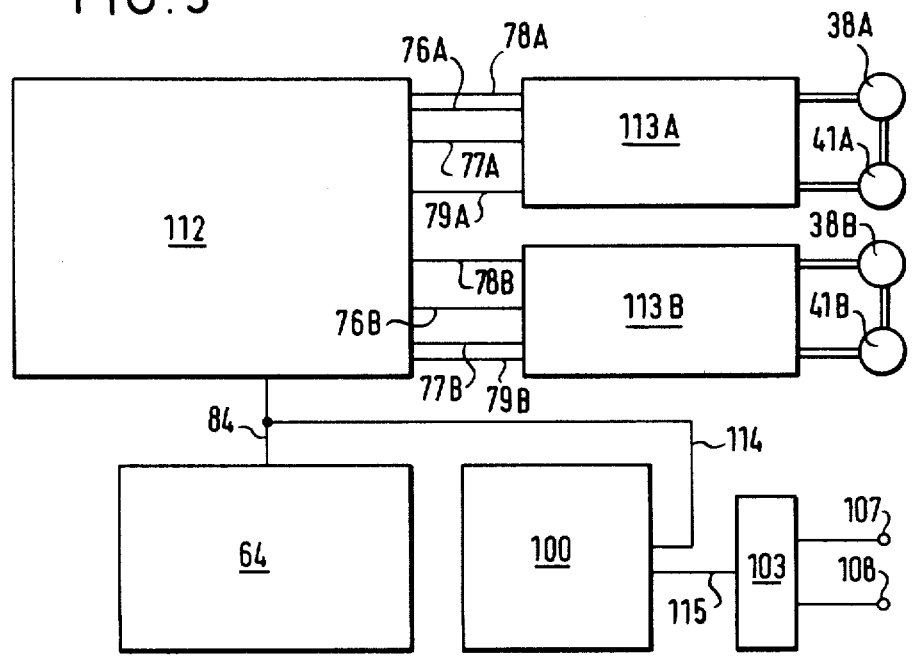
FIG. 3 is a block circuit diagram of a particularly preferred embodiment of an apparatus according to the invention.

FIG. 3 shows the entire apparatus according to FIGS. 5 to 7 as a block circuit diagram. The control circuit shown in FIG. 6 is labelled 112 and is connected to motor control circuits and control circuit 113A and 113B of the type shown in FIG. 5 to control and regulate the electromotor 38A for shaft A and the electromotor 38B for shaft B. The relevant tachogenerators 41A and 41B are also shown. The time disconnection device 64 is also shown as connected to the control circuit 112 via the output 84 and also connected to the interval tracing circuit 100 via line 114 (also see FIG. 7), the interval tracing circuit in turn being connected to the beam swing-out control circuit 103 via the line 115. If the interval tracing circuit 100 is omitted, line 114 is also emitted and the beam swing-out control circuit 103 is directly connected to the time disconnection device 64 via the line 99 shown in a dashed line in FIG. 7.

The method and the apparatus according to the invention has enabled the periodicity of peptidoglycane and the supporting substance of bacteria cell walls to be successfully investigated as is described in detail in a publication by the present inventors H. Formanek and R. Rauscher in the periodical "Ultramicroscopy" 4 (1979), 337–342, the contents of which are incorporated herein by reference.

Attention is drawn to the fact that more exact details concerning the units used and the dimensions of the constructional elements are given in FIGS. 5 to 7 which form part of the disclosure of the present invention.

It is to be noted that the diameter of the electron beam in the object plane is preferably between 0.5 and 2 $\mu$m and that the beam swing-out time can preferably be varied between 1 and 10 seconds and the irradiation period can preferably be varied between 0.2 and 2 seconds in the interval tracing circuit.

The invention is naturally not restricted to the illustrated and described embodiments, but can be realised in numerous ways within the spirit and scope of the claims.

What is claimed is:

1. A method of producing electron beam diffraction patterns, in which an object to be examined is irradiated by means of an electron beam accelerated by a predetermined voltage, the electrons of an electron beam diffracted by the object producing an image on an integrating image apparatus or an integrating image material, the object being examined being an organic or biological substance having a periodic structure, wherein said electron beam has an electron density of less than one electron per square Ångstrom, wherein at least one region of the object corresponding in size to the cross section of the electron beam is irradiated intermittently using an electron beam accelerated by the pre-determined voltage, and wherein irradiation is carried out over such a period of time that the electron density of the electron beam, integrated during this time, is at least equal to the electron density necessary to produce an image, whereby the amount of electron density received at each point of the object is limited.

2. A method according to claim 1, wherein a pre-determined continuous surface of the object is scanned by a continuous movement by the electron beam across said surface at least once, the electron beam being caused to pass over the continuous surface of the object in a pre-determined pattern.

3. A method according to claim 2, wherein the electron beam scans the continuous surface of the object in a continuous raster pattern.

4. A method according to claims 2 or 3, wherein a square or rectangular surface is scanned.

5. A method according to claim 2, wherein the object is moved transversely perpendicularly to the electron beam according to the pre-determined pattern, the said beam remaining stationary.

6. A method according to claim 1, wherein the electron beam is periodically swung out to a position in which it does not irradiate the object.

7. An apparatus for producing electron beam diffraction patterns, comprising an electron beam device for producing a focussed electron beam, said beam having a density which is less than one electron per square Angstrom; an object slide for the object to be examined, the object slide being located in the path of the focussed electron beam in a plane running transversely to the electron beam; an integrating image device or an integrating image material for producing an image of the electrons of the electron beam diffracted by the object, said object being an organic or biological substance having a periodic structure; and a driving device adapted to permit the electron beam to scan a pre-determined continuous surface of the object at least once, said driving device causing the electron beam to continuously scan the surface in a pre-determined pattern to thereby limit the amount of irradiation applied to each one point of the object to be examined to prevent said object from being altered by the application of excessive irradiation.

8. An apparatus according to claim 7, wherein the driving device is adapted to permit the electron beam to continuously scan the surface of the object in a continuous raster pattern.

9. An apparatus according to claim 7, wherein the said driving device comprises an object slide driving device for moving the object slide in a plane transverse to the focussed electron beam, the object slide driving device comprising a first shaft, the rotation of which moves the object slide via a first driving connection in a first coordinate direction in the movement plane, and a second shaft, the rotation of which moves the object slide via a second driving connection in a second coordinate direction in the movement plane, said object slide driving device further comprising a first motor coupled to the first shaft to automatically drive the first shaft A, a second driving device coupled to the second shaft B to automatically drive the second shaft B, a first sensor device coupled to the first shaft to determine the respective position of the object slide in the first coordinate direction, a second sensor device coupled to the second shaft B to determine the respective position of the object slide in the second coordinate direction, and a control device connected to both the driving and sensor devices to effect programmed control of both the driving devices dependent on signals from both sensor devices.

10. An apparatus according to claim 9, wherein each driving device has an electromotor which is coupled to the respective shaft of the object slide adjusting device via a gear and a slip friction clutch.

11. An apparatus according to claim 10, wherein each electromotor is also coupled to a tacho-generator 41 and is coupled together with the tacho-generator to a motor control circuit adapted to maintain the velocity of the electromotor constant by switching over the direction of rotation of the electromotor.

12. An apparatus according to claim 9, wherein each driving device can be decoupled from the respective shaft independent of the sensor devices.

13. An apparatus for producing electron beam diffraction patterns, comprising an electron beam device for producing a focussed electron beam, said electron beam having a density of less than one electron per square Ångstrom; an object slide for the object to be examined, the object slide being located in the path of the focussed electron beam in a plane running transversely to the electron beam; an integrating image device or an integrating image material for producing an image of the electrons of the electron beam diffracted by the object, said object being a organic or biological substance having a periodic structure; an electrically controllable electron beam interruption device; and an interval tracing circuit coupled to the electron beam interruption device to periodically interrupt the focussed electron beam such that the beam interruption time is between one and ten seconds and the irradiation period is between 0.2 and two seconds, the interval tracing circuit including a first control circuit for adjusting the duration of the period during which the focussed electron beam is interrupted and a second control circuit for adjusting the duration of the irradiation period during which a pre-determined region of the object is to be irradiated by the focussed electron beam to thereby prevent said pre-determined region of said object from being altered by excessive or continuous irradiation.

14. An apparatus according to any one of claims 10 or 13 comprising a timewise controlled disconnection device which is coupled to the electron beam device and also to the control device or interval tracing circuit, to interrupt the focussed electron beam or to swing the beam out of the region of the object and optionally to disconnect the driving devices.

15. The method of claim 1 wherein at least one region of the object corresponding in size to the cross section of the electron beam is irradiated intermittently with said electron beam; and wherein one point of the object which absorbs energy during irradiation has an opportunity to cool during the periods in which said point is not being irradiated.

* * * * *